United States Patent
Ota et al.

(10) Patent No.: US 7,977,210 B2
(45) Date of Patent: Jul. 12, 2011

(54) SEMICONDUCTOR SUBSTRATE AND SEMICONDUCTOR DEVICE

(75) Inventors: Chiharu Ota, Tokyo (JP); Johji Nishio, Machida (JP); Takashi Shinohe, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 247 days.

(21) Appl. No.: 12/277,749

(22) Filed: Nov. 25, 2008

(65) Prior Publication Data

US 2009/0134405 A1 May 28, 2009

(30) Foreign Application Priority Data

Nov. 27, 2007 (JP) ................. 2007-306029

(51) Int. Cl.
*H01L 21/30* (2006.01)
(52) U.S. Cl. .... 438/459; 438/534; 257/77; 257/E21.064
(58) Field of Classification Search ............... 257/77, 257/E21.064; 438/459, 534
See application file for complete search history.

(56) References Cited

U.S. PATENT DOCUMENTS

| | | | | |
|---|---|---|---|---|
| 5,027,168 A | * | 6/1991 | Edmond | 257/103 |
| 7,468,314 B2 | * | 12/2008 | Shenoy et al. | 438/570 |
| 2007/0066039 A1 | * | 3/2007 | Agarwal et al. | 438/534 |
| 2007/0138482 A1 | * | 6/2007 | Tanimoto | 257/77 |
| 2008/0197360 A1 | * | 8/2008 | Sriram et al. | 257/77 |

FOREIGN PATENT DOCUMENTS

JP 2003-86816 3/2003

* cited by examiner

*Primary Examiner* — Wael M Fahmy
*Assistant Examiner* — John C Ingham
(74) *Attorney, Agent, or Firm* — Ohlandt, Greeley, Ruggiero & Perle, L.L.P.

(57) ABSTRACT

A semiconductor substrate includes a silicon carbide substrate having a first impurity concentration, a first silicon carbide layer formed on the silicon carbide substrate and having a second impurity concentration, and a second silicon carbide layer of a first conductivity type formed on the first silicon carbide layer and having a third impurity concentration, wherein the second impurity concentration is higher the an either the first impurity concentration or the third impurity concentration.

12 Claims, 5 Drawing Sheets

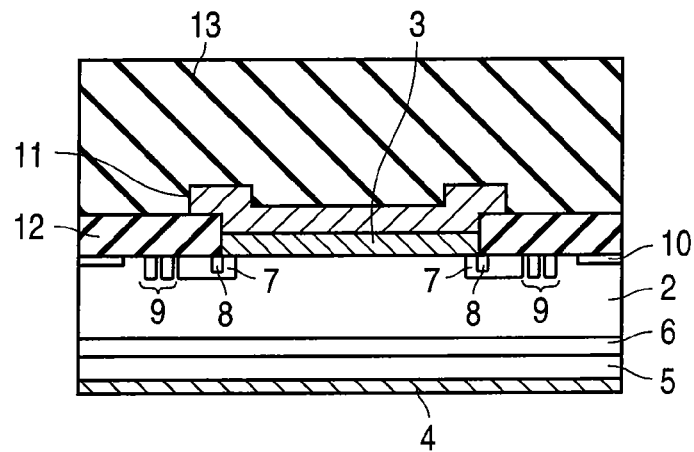
F I G. 7
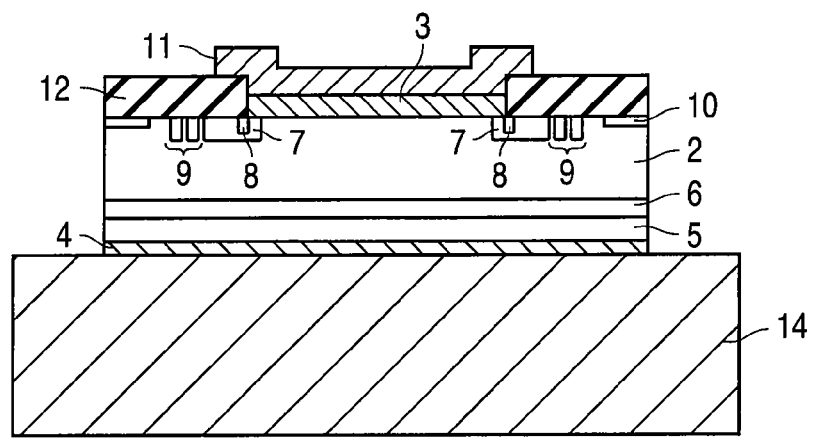
F I G. 8
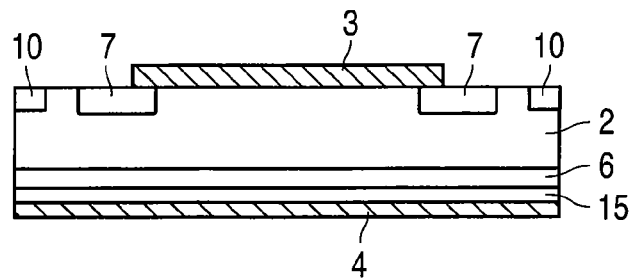
F I G. 9

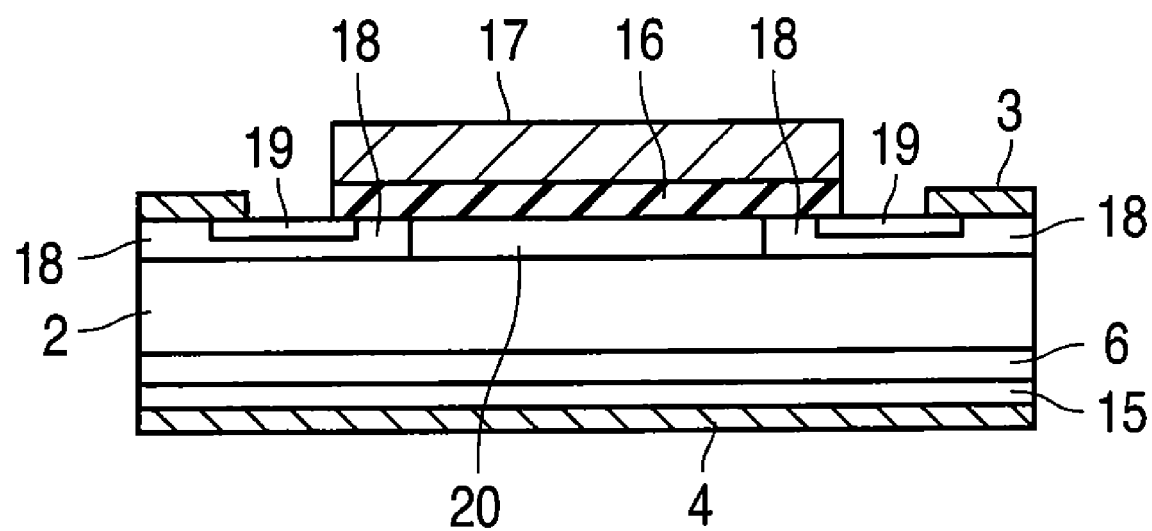
F I G. 13

SEMICONDUCTOR SUBSTRATE AND SEMICONDUCTOR DEVICE

CROSS-REFERENCE TO RELATED APPLICATIONS

This application is based upon and claims the benefit of priority from prior Japanese Patent Application No. 2007-306029, filed Nov. 27, 2007, the entire contents of which are incorporated herein by reference.

BACKGROUND OF THE INVENTION

1. Field of the Invention

The present invention relates to a silicon carbide (SiC) substrate and a vertical semiconductor device using such substrate and to a manufacturing method thereof. More particularly, it relates to the art of reducing forward resistance.

2. Description of the Related Art

A vertical semiconductor device is known in which a current in a device runs from the first main surface to the second main surface of the device. The performance of the semiconductor device of this type is primarily determined by the structure of a device which is formed in an epitaxial layer formed on the surface of a substrate, and the substrate serves to hold the epitaxial layer and maintain its mechanical strength.

For example, a conventional Schottky barrier silicon carbide (SiC) diode comprises an n-type SiC substrate, an SiC homoepitaxial layer formed on the surface of the substrate, anode (electrode) further formed thereon, and a cathode (electrode) formed on the backside of the n-type SiC substrate.

In the case of the vertical semiconductor device, the resistance of a drift layer is determined by measuring the I-V characteristics between the anode and cathode. Its resistance is expressed as a sum of (surface contact resistance a)+(drift layer resistance b)+(substrate resistance c)+(backside surface contact resistance d). That is, the breakdown resistance of the device is only determined by the drift layer resistance b, but for forward resistance, (surface contact resistance a)+(substrate resistance c)+(backside surface contact resistance d) are added to the drift layer resistance b. It is therefore necessary to particularly reduce (substrate resistance c)+(backside surface contact resistance d) that are formed on the backside surface.

To this end, an attempt has been made to reduce the thickness of the substrate, or to increase the concentration of impurities in the backside surface of the substrate to reduce the contact resistance. However, in the former thickness reduction, there is a fear that the thin substrate may crack during a device fabrication process after the formation of the thin substrate, so that the thickness reduction has to be carried out after the formation of a semiconductor upper structure. In the latter case, an increase of concentration can be normally achieved by ion implantation and the following activation anneal, and an anneal at 1500° C. or higher, in the case of SiC, is required for activation. Therefore, a process using a material which receives a bad influence, has to be carried out after the anneal, and it has been impossible to reduce the thickness of the substrate and increase the concentration. Consequently, nothing has been particularly done to give priority to one of the above options and consider an approach to the other option together.

On the other hand, there has been a proposal to use a substrate in which a high-concentration layer is formed on the backside to reduce contact resistance, and form an electrode material on the high-concentration layer (refer to JP-A 2003-86816 [KOKAI]).

However, the technique in the above KOKAI Publication is also incapable of eliminating the resistance inherent in the substrate. As a commercially available 4H-SiC wafer for vertical power devices has a thickness of about 400 μm and a resistivity of about 0.020 Ωcm, the substrate has a resistance of 0.8 Ωcm². The forward resistance of an SiC diode of a 1200 V class is several mΩcm², so that the elimination of the substrate resistance, if possible, has a great effect. In addition, the contact resistance is usually as high as 0.1 mΩcm² and the value in the whole wafer is nonuniformity-distributed, so that the reduction of the contact resistance is also required.

It has therefore been desired to obtain a thin SiC semiconductor substrate with a low resistance, and a semiconductor device using such a substrate.

BRIEF SUMMARY OF THE INVENTION

According to a first aspect of the invention, there is provided a semiconductor substrate which includes:

a silicon carbide substrate having a first impurity concentration;

a first silicon carbide layer formed on the silicon carbide substrate and having a second impurity concentration; and a second silicon carbide layer of a first conductivity type formed on the first silicon carbide layer and having a third impurity concentration, wherein the second impurity concentration is higher than either the first impurity concentration or the third impurity concentration.

According to a second aspect of the invention, there is provided a semiconductor device which includes:

a first silicon carbide layer of a first conductivity type having a thickness of 50 μm or less;

a second silicon carbide layer of the first conductivity type formed on a top surface of the first silicon carbide layer and having an impurity concentration lower than that of the first silicon carbide layer;

a first electrode formed on the top surface of the second silicon carbide layer and making a Schottky contact with the second silicon carbide layer; and a second electrode formed on a backside of the first silicon carbide layer.

According to a third aspect of the invention, there is provided a semiconductor device comprising:

a first silicon carbide layer of a first conductivity type having a thickness of 50 μm or less;

a second silicon carbide layer of a second conductivity type formed on the first silicon carbide layer and having an impurity concentration lower than that of the first silicon carbide layer;

a first electrode formed on a top surface of the second silicon carbide layer; and a second electrode formed on a backside of the first silicon carbide layer.

According to a fourth aspect of the invention, there is provided a semiconductor device which includes:

a first silicon carbide layer having a thickness of 50 μm or less;

a second silicon carbide layer of a first conductivity type formed on the first silicon carbide layer and having an impurity concentration lower than that of the first silicon carbide layer;

a first silicon carbide region of a second conductivity type selectively provided on the second silicon carbide layer;

a second silicon carbide region of the first conductivity type formed on a surface of the first silicon carbide region and inside the first silicon carbide region;

a gate insulating layer selectively formed on the second silicon carbide layer, on the first silicon carbide region adjacent to the second silicon carbide layer, and on a surface of the second silicon carbide region;

a gate electrode formed on the gate insulating layer;

a first main electrode selectively formed on the first silicon carbide region and the second silicon carbide region; and a second main electrode formed on a backside of the first silicon carbide layer.

BRIEF DESCRIPTION OF THE SEVERAL VIEWS OF THE DRAWING

FIGS. 3 to 8 are sectional views showing stepwise a process of manufacturing the semiconductor device in the first embodiment;

FIG. 9 is a sectional view of a semiconductor device (pn diode) according to a second embodiment;

FIG. 13 is a sectional view of a semiconductor device (vertical IGBT) according to a fourth embodiment.

DETAILED DESCRIPTION OF THE INVENTION

Hereinafter, embodiments of the present invention will be described with reference to the drawings. It is to be noted that the invention is not limited to the embodiments described below and various contrivances are applied thereto. It is also to be noted that a first conductivity type is referred to as an n-type and a second conductivity type is referred to as a p-type in the embodiments described below.

First Embodiment

Figure 1:
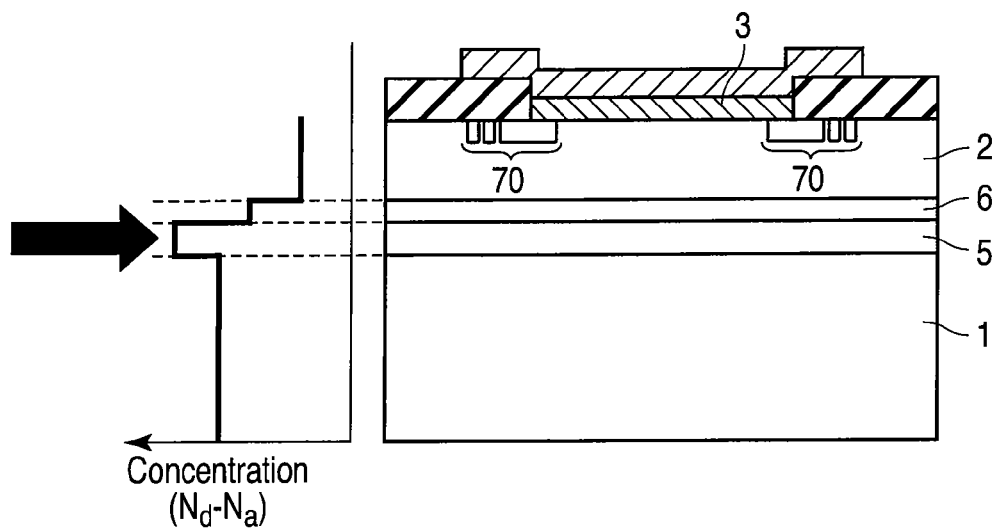
FIG. 1 is a schematic view showing the section of a semiconductor device (element) in a first embodiment, and the impurity concentration profile of a semiconductor substrate used.
Figure 2:
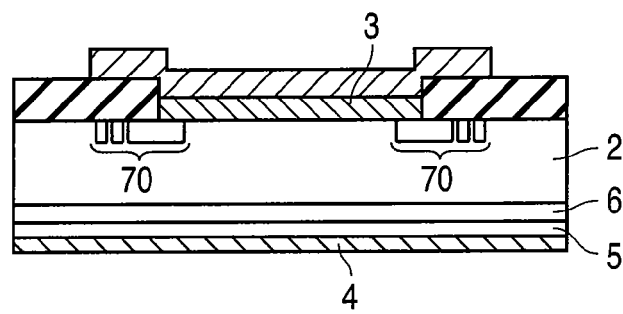
FIG. 2 is a sectional view of the semiconductor device (Schottky barrier diode) according to the first embodiment.

FIGS. 1 and 2 are sectional views of a semiconductor device (Schottky barrier diode) according to a first embodiment of the present invention. FIG. 1 shows a state one step before a final form in which a semiconductor device (element) is formed on an SiC semiconductor substrate, and FIG. 2 shows the final form of the semiconductor device. A graph attached on the left end of FIG. 1 shows impurity concentration distribution of the semiconductor substrate (an SiC substrate and SiC semiconductor layers). In the drawings, 1 denotes an $n^+$-type SiC bulk substrate, 2 denotes an $n^-$-type SiC epitaxially grown layer, 3 denotes an anode, 4 denotes a cathode, 5 denotes an $n^{++}$-type SiC ultra-high-concentration layer formed in the vicinity of the top surface of the $n^+$-type SiC bulk substrate, and 6 denotes an n-type SiC buffer layer formed between the $n^{++}$-type SiC ultra-high-concentration layer 5 and the $n^-$-type SiC epitaxial layer 2.

As shown on the left end of FIG. 1, the descending order of concentration of the respective semiconductor layers is: the $n^{++}$-type ultra-high-concentration layer 5, the $n^+$-type bulk substrate 1, the n-type buffer layer 6 and the $n^-$-type epitaxial layer 2. Further, an edge termination structure 70 is selectively formed in the upper part of the $n^-$-type epitaxially grown layer 2, and the anode 3 is selectively formed on the $n^-$-type epitaxially grown layer 2 to be in contact with the inner end of the edge termination structure 70.

Then, as shown in FIG. 2, the backside of the $n^+$-type bulk substrate 1 is ground in a state where the top surface of the device shown in FIG. 1 is covered with a top protection tape (not shown). At this point, prevention of characteristic deterioration in the upper structure of the semiconductor device is important. Moreover, the grinding is terminated at a point within the $n^{++}$-type ultra-high-concentration layer 5. Then, an ohmic electrode 4 as a cathode is formed after the backgrinding. The state shown in FIG. 2 where the top protection tape has finally been removed is the final form in the first embodiment.

Then, the operation of the above semiconductor device is described. A case is taken as an example in the above-described embodiment in which a voltage is applied so that the anode 3 may be positively biased with regard to the cathode 4, so that a forward current runs from the anode 3 to the cathode 4. A current pathway in the substrate can be short because the thickness of the semiconductor substrate is small, and the forward resistance can be low. It is also possible to decrease an on-voltage at a given current density value (e.g., 100 A/cm$^2$, 500 A/cm$^2$) in forward I-V characteristics. Thus, this structure is highly effective particularly when applied to a switching system.

Furthermore, when the anode 3 is negatively biased with respect to the cathode 4, the breakdown voltage is held not by the bulk substrate 1 but by a drift layer, that is, the epitaxially grown layer 2, so that there is no deterioration of the breakdown voltage due to the thickness reduction of the bulk substrate 1.

Next, a method of manufacturing the semiconductor device in the present embodiment is described. First, an SiC ingot is produced by an SiC bulk producing method, for example, a sublimation method, and then the ingot is sliced at a fixed surface orientation. An SiC bulk substrate is then manufactured by mechanical polishing and chemical mechanical polishing (CMP). The doping concentration in the SiC bulk substrate ranges from about $1\times10^{18}$ to $1\times10^{19}$/cm$^3$, and is herein $8\times10^{18}$/cm$^3$. It is possible in principle to mix more impurities, which is, however, not suitable for a device because it is apt to cause a crystalline defect such as a stacking fault and decrease a crystal quality.

Subsequently, as shown in FIG. 1, silane, propane and hydrogen are supplied as raw materials to a reaction tube in an epitaxial growth equipment, and the SiC ultra-high-concentration layer 5 is formed on the SiC bulk substrate 1. In this case, N is generally supplied as an impurity material with a concentration of about $1\times10^{14}$ to $1\times10^{17}$/cm$^3$. However, in the present invention, $N_2$ is supplied so that a greater amount of N is contained in the layer 5 than in the SiC bulk substrate 1 with the aim of decreasing resistance, so that the impurity concentration of the SiC ultra-high-concentration layer 5 may be, for example, $1\times10^{20}$ to $1\times10^{22}$/cm$^3$. In the present embodiment, the impurity concentration thereof is $1\times10^{21}$/cm$^3$. The layer formation temperature is about 1550 to 1600° C., and the ultra-high-concentration layer 5 of several micrometers is formed by a growth of about one hour.

There is no specific upper limit in the thickness of the ultra-high-concentration layer 5, and growth time has only to be increased with the same supply amount of the raw materials, pressure and temperature. A greater thickness of the ultra-high-concentration layer 5 is preferable because it increases tolerance at the grinding termination point in the subsequent grinding step. On the other hand, the thickness of the ultra-high-concentration layer 5 has to be as small as possible to manufacture a low-resistance substrate, so that it is considered to be desirably 2 μm or more and 50 μm or less after the grinding.

Thus, a first-stage semiconductor substrate having the ultra-high-concentration layer 5 intended to decrease the resistance in the forward direction of the vertical device is completed on the top surface of the SiC bulk substrate 1.

Then, in the same furnace, the SiC buffer layer 6 is formed on the ultra-high-concentration layer 5 to maintain lattice matching with the SiC epitaxial layer 2 which is a low-concentration layer is formed later. The impurity concentration of the buffer layer 6 is about $8 \times 10^{17}$ to $2 \times 10^{18}/cm^3$ which is between the impurity concentration of the epitaxial layer 2 determined by the device requirements and the impurity concentration of the ultra-high-concentration layer 5. The thickness of the buffer layer 6 is 0.3 to 1 μm. Herein, the impurity concentration is $1 \times 10^{18}/cm^3$, and the thickness is 0.5 μm.

In the epitaxial growth technique, the steep change of the impurity concentration can be simply obtained by changing the supply amount of the $N_2$ gas without decreasing the crystal quality, but the supply amount of the $N_2$ gas may be gradually reduced to slope the impurity concentration in the buffer layer so that the impurity concentration is high on the side of the substrate 1 and low on the side of the epitaxial layer 2.

Then, the epitaxial layer 2 serving as the drift layer is formed on the buffer layer 6. The impurity concentration and thickness of the drift layer 2 are determined by the design of the device. While the concentration in the drift layer 2 is about $1 \times 10^{15}$ to $2 \times 10^{16}/cm^3$, and the thickness of the drift layer is about 4 to 10 μm in the case of a 600 V class and 1200 V class Schottky barrier diode, herein, the impurity concentration is $8 \times 10^{15}/cm^3$ and the thickness of the drift layer 2 is 8 μm. The buffer layer 6 may be omitted if there is no crystalline problem in the drift layer 2 subsequently grown.

In this manner, a semiconductor device having the ultra-high-concentration layer 5 and the SiC epitaxial layer 2, which is intended to decrease the forward resistance of the vertical device is completed on the top surface side of the SiC bulk substrate 1.

Figure 4:
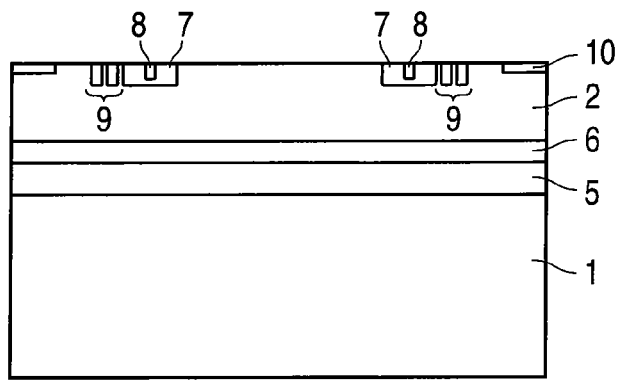

Next, a method of manufacturing a low-resistance semiconductor device using the semiconductor substrate with two layers is described. As shown in FIG. 4, a RESURF region 7 having a p⁻-type impurity concentration is formed in the surface of the n⁻-type epitaxial layer 2 of the semiconductor substrate having the ultra-high-concentration layer 5. An edge termination layer 8 having a p⁺-type impurity concentration can be formed at end potion of the Schottky contact hole, which is formed later.

Furthermore, a p⁻-type guard ring 9 is formed in the surface of the n⁻-type epitaxial layer 2 in such a manner as to enclose the p⁻-type RESURF region 7, and this guard ring 9 functions as a breakdown voltage increasing structure. In this case, more than one guard ring 9 can achieve higher effects.

The RESURF region 7 and the guard ring 9 have about the same impurity concentration, which is, for example, $1 \times 10^{17}$ to $1 \times 10^{18}/cm^3$. Further, an n⁺-type channel stopper 10 for fixing the potential of the semiconductor is disposed at a device edge portion. The concentration therein is, for example, $1 \times 10^{19}$ to $2 \times 10^{20}/cm^3$, and is $5 \times 10^{19}/cm^3$ herein.

Figure 5:
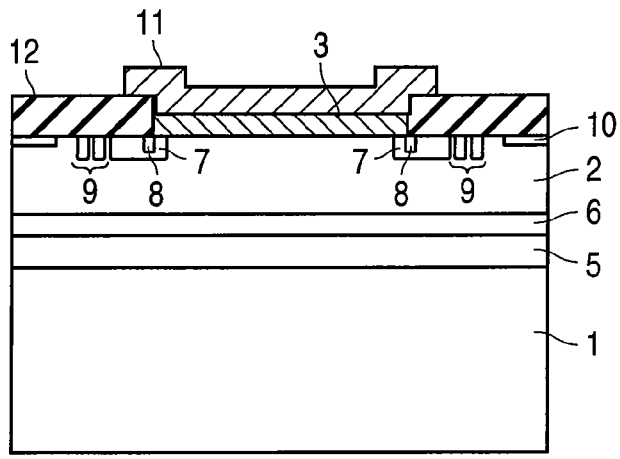

Subsequently, as shown in FIG. 5, an insulating layer 12 is formed on the whole surface of the n⁻-type epitaxial layer 2, and a contact hole for the first electrode is formed so that its end is located above the RESURF region 7. $SiO_2$ or SiN is often used as the material of the insulating layer 12, and $SiO_2$ is used herein.

Then, the first electrode (anode) 3 is provided to contact the surface of the n⁻-type epitaxial layer 2 exposed through the above-mentioned contact hole. A material suitable for Schottky contact with n-type SiC, such as Ti, Ni, Au or Mo, is used as the material of the anode. In the present embodiment, Ti is used.

On the first electrode, a metal field plate 11 electrically connected to the first electrode is formed. The metal field plate 11 also extends onto the insulating layer 12, and is opposite to the epitaxial layer 2 via the insulating layer 12. The material of the metal field plate includes a material having an outermost surface suitable for wire bonding such as Al and Au, and Al is used herein.

When there is any problem of interface adherence at an interface between the Schottky electrode 3 and the epitaxial layer 2, a material which improves its contact can be interposed as an interlayer between the Schottky electrode 3 and the metal field plate 11. Since applying a reverse voltage cause a concentration of the electric field on the end of the field plate region, the edge termination structure 70 including the p⁻-type RESURF region 7 and the p⁻-type guard ring 9 is preferably disposed under the end of the field plate for a high breakdown voltage.

Figure 6:
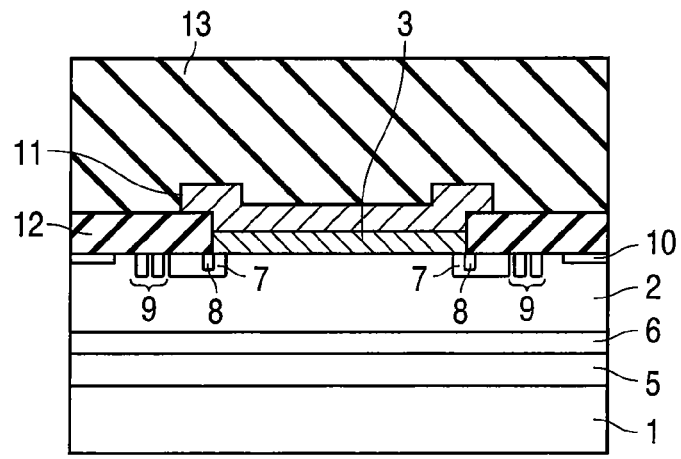

Then, as shown in FIG. 6, the surface is protected by, for example, a tape 13, and the backside of the SiC bulk substrate 1 is ground. The thickness of the bulk substrate 1 is typically about several hundred μm, so that mechanical polishing is efficient up to a thickness of 100 μm. However, it is necessary to pay attention so that the device surface may not be damaged to increase the polishing velocity. Then, the velocity of the mechanical grinding, the kind of grinding, etc., are changed depending on the thickness of the substrate to be ground, and the substrate is finally ground to several micrometers. The point of stopping the grinding is determined by checking the exposure of the ultra-high-concentration layer 5 by means of a thickness monitor or a C-V measurement using a dummy substrate.

Then, after cleaning, the cathode 4 is formed at a room temperature, on the backside of the ultra-high-concentration layer 5 with the substrate holding tape 13 attached, as shown in FIG. 7. Since Ti have a good contact with a C-face of n-type SiC at a room temperature, the cathode 4 can be sufficiently formed even at a room temperature. In order to further decrease the contact resistance of the cathode, the ohmic electrode should be formed in a stack structure (not shown) of, for example, Ti/Ni/Au.

Subsequently, as shown in FIG. 8, the completed device is attached to the dicing tape (not shown) and diced after removing the tape 13. Thinned wafer includes the problem of strain and warp, but the diced chip of a small size has a higher mechanical strength and the risk of break and warp is decreased. Then the chip is affixed onto a low-resistance substrate 14 such as a direct bonded copper (DBC) substrate to reinforce the mechanical strength of the semiconductor device composed of the thin SiC semiconductor layers. Then, the upper tape material 13 is removed to form a passivation material (not shown) on the top as a breakdown voltage increasing structure, thereby completing the semiconductor device according to the first embodiment.

In addition, although the semiconductor device is an n⁺-type high impurity concentration substrate in the first embodiment, the conductivity type of the semiconductor substrate and the concentration therein are not limited to the above, and there is no problem with a p-type or insulating type substrate. After the semiconductor device has been completed, the semiconductor substrate is polished so that the ultra-high-concentration layer 5 alone remains and the surface of the ultra-high-concentration layer 5 serves as a surface to contact the backside ohmic electrode. Thus, there is no problem if the semiconductor substrate has a low impurity concentration or a high-resistance.

However, since the buffer layer and the epitaxial layer are formed on the substrate, a high quality of a crystal is required with less crystalline defects typified by a micropipe, an etch pit, a screw dislocation, an edge dislocation and a stacking fault so that the quality of the epitaxially grown layer serving as the drift layer may be high.

Further, in the first embodiment, nitrogen is used as an n-type impurity, but phosphorous may be used instead.

First Modification of Manufacturing Method of First Embodiment

Figure 3:
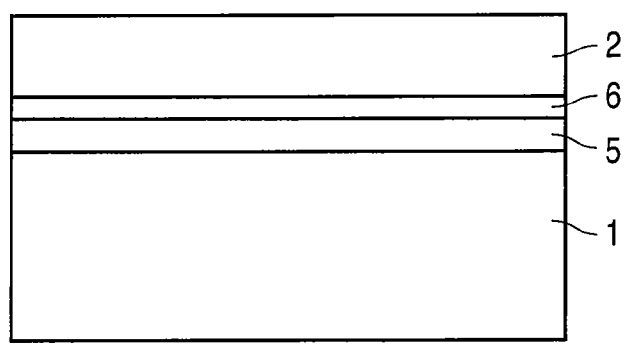

Although the ultra-high-concentration layer 5 in the above-described embodiment is formed by epitaxial growth, it may be formed by ion implantation instead. A method of forming the ultra-high-concentration layer by ion implantation is described below with the aid of FIG. 3.

First, an n-type ion species such as nitrogen (N) or phosphorus (P) is implanted from the top surface side of the manufactured SiC bulk substrate 1. Due to the high-concentration ion implantation, the implantation is preferably carried out at a high substrate temperature of 400° C. or more considering the crystalline damage of the bulk substrate 1, and the substrate temperature is 500° C. herein. When the substrate temperature is controlled by the temperature of a heater, the heater temperature should be set considering the thermal transfer rate to the substrate and the thermal conductivity of the substrate itself.

Since the ion implantation has to reach as deep as possible, a currently achievable maximum ion implantation energy of 8 MeV is used. The dose is set at about $1 \times 10^{18}/cm^2$ so that the concentration may be about $1 \times 10^{21}$ to $1 \times 10^{22}/cm^3$. A box profile is employed as a profile so that higher concentration regions may be arranged on higher sides.

Then, the buffer layer 6 and the drift layer 2 are formed by epitaxial CVD equipment. At this point, as step bunching or a crystalline damage may be caused on the substrate surface in which the concentration has been increased due to the ion implantation, the formation of the buffer layer 6 should be started after the SiC surface has been etched with hydrogen before the buffer layer grows. Alternatively, the supply amount of the $N_2$ gas may be gradually reduced during the growth of the buffer layer 6 to slope the impurity concentration in the buffer layer 6 so that the impurity concentration is high on the side of the substrate and low on the side of the epitaxial layer. Subsequently, the epitaxial layer 2 serving as the drift layer is formed thereon, and then the device may be produced in the same manner as in the first embodiment.

An ion-implanted layer in which ions have been implanted from the top surface of the SiC bulk substrate 1 is activated by undergoing an epitaxial CVD process even without being subjected to activation anneal in particular. The currently maximum energy of ion implantation is 8 MeV, and if this energy is used to implant P-ions into the SiC bulk substrate 1, the depth of the ultra-high-concentration layer 5 to be formed will be about 2.5 to 3.5 µm. The remaining thickness of the substrate needs to be about 2.5 to 3 µm at the time of polishing the wafer backside. If the maximum ion implantation energy is further increased, the ion species infiltrates deeper into the SiC substrate, so that during the polishing, the degree of freedom increases in the stop point and the tolerance increases in the process of polishing the wafer backside.

As described above, according to the first embodiment, it is possible to provide a low-resistance SiC substrate and a semiconductor device using such substrate. Although the use of SiC as the semiconductor material has been described in the first embodiment, the material is not limited to SiC, and it goes without saying that similar effects are also obtained if, for example, GaN or diamond is used.

Second Modification of Manufacturing Method of First Embodiment

As to the method of thinning the substrate in the above-described embodiment, the substrate may be processed by reactive dry etching instead of polishing. A fluoride gas such as $SF_6$ is used as a gas system to etch the backside of SiC in high-density plasma, such that the backside of the SiC can be polished in ten minutes at a relatively high rate of about 50 µm. Moreover, damage to the processed surface can be reduced owing to the ionic reaction and a value of warp or bow after the dry etching can be reduced rather than that of polishing. As a surface protection material for this purpose, it is possible to use a material fitting a semiconductor process, such as a resist. The resist can be easily removed. Moreover, if the elimination of damage in polishing and the efficiency of the time for the thickness reduction are taken into account, the thickness may be reduced to some degree by polishing, and then damaged layers produced by the polishing and serving as a high-resistance component may be removed by reactive dry etching.

Third Modification of Manufacturing Method of First Embodiment

The substrate thinning method aforementioned is applicable to any substrate material. If a high-concentration 3C-SiC layer and a low concentration 3C-SiC layer is formed on Si substrate and the materials composing the 3C-SiC device are resistant to hydrofluoric acid, Si can be removed by wet etching in the hydrofluoric acid solution.

As described above, according to the first embodiment, it is possible to obtain a Schottky barrier diode using SiC layers with low resistance.

Second Embodiment

Figure 10:
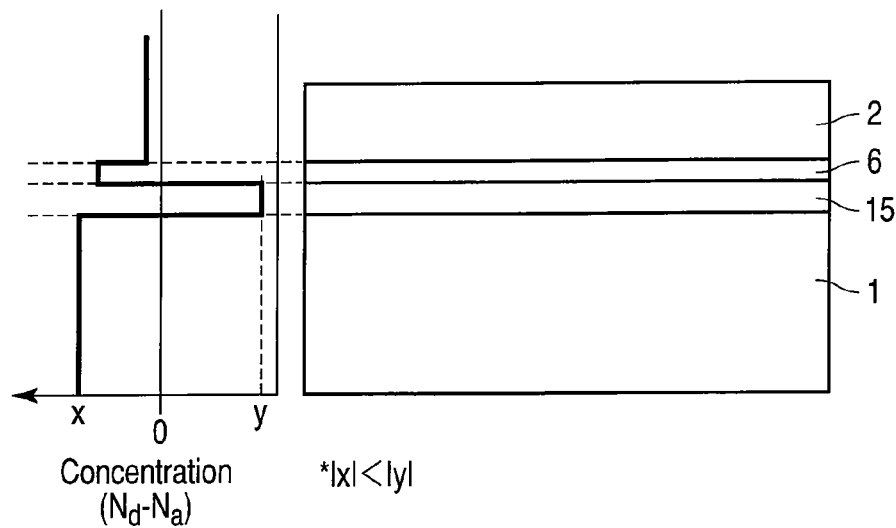
FIG. 10 is a schematic view showing the layer structure of a semiconductor substrate according to the second embodiment, and an impurity concentration profile.

FIG. 9 is a sectional view of a pn diode according to a second embodiment of the present invention. FIG. 10 is a sectional view showing the layer structure of a semiconductor substrate used for this diode, and shows the concentration profile of component layers on the left end. The same numbers are assigned to the same parts as in the first embodiment for clarity.

In the pn diode of the second embodiment, a $p^{++}$-type SiC ultra-high-concentration layer 15 is provided on the top surface side of a SiC substrate 1. Thus, as shown in FIG. 10, the concentration profile shows a reverse polarity for the ultra-high-concentration layer 15.

As shown in FIG. 9, an $n^-$-type SiC drift layer 2 is formed on the top of the ultra-high-concentration layer 15 via an n-type SiC buffer layer 6, and a first electrode (cathode) 3 in ohmic contact is selectively formed on the surface of the $n^-$-type drift layer 2. A second electrode (anode) 4 in ohmic contact is disposed on the backside of the $p^{++}$-type ultra-high-concentration layer 15 exposed by polishing the SiC substrate 1, thereby achieving the function as the pn diode.

Furthermore, a p-type ion-implanted layer 7 as a breakdown voltage increasing structure located to overlap the end of the first electrode 3 is disposed in the surface of the n⁻-type drift layer 2. An edge termination layer (8) may be formed in the p-type ion-implanted layer as in the first embodiment. It is also possible to form a guard ring (9) and a channel stopper (10).

A method of manufacturing this pn diode is briefly described with the aid of FIGS. 3 to 8 in the first embodiment. First, as in FIG. 3, the p⁺⁺-type ultra-high-concentration layer (not 5 but 15 in the present embodiment) having a thickness of several micrometers to several tens of micrometers and an impurity concentration of about $1 \times 10^{17}$ to $10^{21}$/cm³ is produced on the 4H-SiC semiconductor substrate 1 by CVD epitaxial growth. As a dopant in this case, boron (B) or aluminum (Al) is used. Then, the n-type buffer layer 6 and the n⁻-type drift layer 2 are formed. Depending on the desired value for the breakdown voltage of the drift layer 2, the concentration in the drift layer is about $6 \times 10^{15}$ to $1 \times 10^{16}$/cm³, and its thickness is about 6 to 10 μm in the case of a 1200 V system.

Then, as in FIG. 4, the p⁻ and p⁺ breakdown voltage structures 7, 8 are formed by Al or B ion implantation, and the n⁺ channel stopper 10 is formed by phosphorus (P) or nitrogen (N) ion implantation. A surface field oxide film is formed after activation anneal, and a contact hole is made therein, and then the first electrode 3 is formed using an electrode material such as Ni serving as an ohmic electrode. The first electrode 3 comprises, for example, Ti/Al. For example, Ti/Al, Ti/Au or Ti/Ni/Au can be used for the p-type backside electrode. The first electrode 3 is patterned by etching with Al and Ti via a resist.

Subsequently, the top surface is protected by, for example, a tape material 13, and the wafer backside is mechanically ground. The thickness of the substrate is typically about several hundred μm, so that mechanical polishing is efficient up to a thickness of 100 μm. Then, the velocity of the mechanical grinding, the kind of grinding, etc., are changed to suit to the thickness of the substrate to be ground, and the substrate is finally ground to several micrometers to 50 μm. The point of stopping the grinding is determined by checking the exposure of the ultra-high-concentration layer 15 via a thickness monitor or a C-V measurement using a dummy substrate.

Then, after cleaning, the second electrode 4 is formed on the backside of the ultra-high-concentration layer 15 with the substrate holding tape 13 attached. At this point, the second electrode 4 not only serves as an anode contact but also serves to hold the substrate, so that a thickness of about several tens of micrometers to 100 μm should be provided in the second electrode by, for example, electrolytic plating. In the case of a composite material such as Ti/Al, Ti/Al may be first formed by, for example, evaporation, and then Al may be formed thereon by electroplating. Subsequently, the tape material 13 is removed, and then a heat treatment of 950° C. or more is carried out to reduce the contact resistance of the first and second electrodes.

In this case, the resistance of the p⁺⁺-type layer (ultra-high-concentration layer 15) which generally accounts for substrate resistance allows a reduction in the resistance between the anode and the cathode because the p⁺⁺-type layer has an ultra-high-concentration and an extremely small thickness, so that the on-resistance of the device is reduced. On the other hand, the breakdown voltage does not change because the n⁻-type drift layer 2 alone sustains an reverse electric field. Moreover, the conductivity type can be reversed to provide a pn diode composed of an n⁺⁺-type ultra-high-concentration layer 5 and a p⁻-type drift layer (2). Alternatively, it is also possible to provide a pin diode composed of an n⁺⁺-type ultra-high-concentration layer 5, an n⁻-type drift layer 2, and a p⁺-type layer formed on the n⁻-type drift layer 2.

Furthermore, reactive ion etching may be used as method of thinning the substrate as in the second modification of the manufacturing method of the first embodiment. In the case of the structure in which the substrate is made of Si and 3C-SiC layer is formed thereon, Si may be removed by wet etching of hydrofluoric acid system depending on the structure.

As described above, according to the second embodiment, it is possible to provide a pn diode using SiC layers with low resistance.

Third Embodiment

Figure 11:
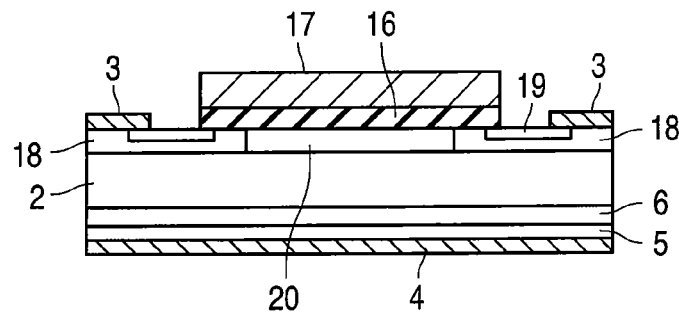
FIG. 11 is a sectional view of a semiconductor device (vertical MOSFET) according to a third embodiment.

FIG. 11 is a sectional view of essential parts of a vertical MOSFET according to a third embodiment of the present invention. An ultra-high-concentration n⁺⁺-type layer 5 is provided on the top surface side of the SiC substrate 1 (not shown) in the first embodiment, and an n⁻-type drift layer 2 is formed thereon via an n-type buffer layer 6. A p⁻-type region 18 is selectively provided on the surface of the n⁻-type drift layer 2. An n⁻-type layer 20 is provided between the p⁻-type regions 18. An n⁺-type source contact region 19 is selectively formed on the surface of the p⁻-type region 18. A source electrode 3 in ohmic contact is selectively formed on the p⁻-type region 18 and the n⁺-type source contact region 19. A gate electrode 17 is selectively formed on the p⁻-type region 18 and the n⁻-type layer 20 via a gate insulating layer 16 made of a thin oxide, nitride or high-dielectric layer. A drain electrode 4 in ohmic contact is formed on the backside of the n⁺⁺-type ultra-high-concentration layer 5 exposed by polishing the SiC substrate 1.

Figure 12:
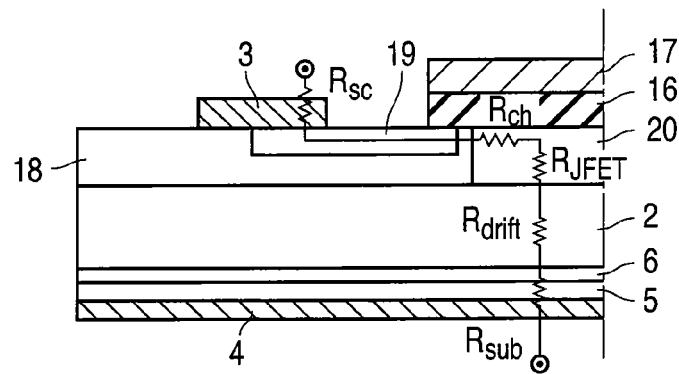
FIG. 12 is a schematic view for explaining the resistance components of the vertical MOSFET.

In the case of the vertical MOSFET, the main resistance components include, as shown in the schematic view for one device in FIG. 12, source contact resistance $R_{sc}$, channel resistance $R_{ch}$, JFET resistance $R_{JFET}$, drift resistance $R_{drift}$ and substrate resistance $R_{sub}$. While the JFET resistance changes depending on a channel length, the contribution of the substrate resistance is about 20% when the channel length is 2.5 μm. Therefore, the substrate resistance can be reduced by the present invention, which highly contributes to decreasing of loss in the device.

A method of manufacturing the vertical MOSFET according to the third embodiment is described with the aid of the drawings in the first embodiment. First, as in FIG. 3 in the first embodiment, the ultra-high-concentration n⁺⁺-type layer 5 having an impurity concentration of $1 \times 10^{20}$ to $1 \times 10^{22}$/cm³ and a thickness of several micrometers to several tens of micrometers is formed on the highly crystalline 4H-SiC semiconductor substrate 1 by epitaxial growth. Nitrogen (N), for example, is used as an impurity in this case. Then, the n-type buffer layer and the n⁻-type drift layer are formed by epitaxial growth.

Nitrogen (N), for example, is used for the impurity element of the n-type buffer layer 6 and the n⁻-type drift layer 2. The impurity concentration in the n-type buffer layer 6 is $1 \times 10^{17}$ to $5 \times 10^{18}$/cm³, and the impurity concentration in the ne-type drift layer 2 is $1 \times 10^{15}$ to $2 \times 10^{16}$/cm³ in the case of a design breakdown voltage of 1200 V, for example. The impurity concentration of the drift layer 2 can be adjusted in accordance with a design breakdown voltage. The thickness of the buffer layer 6 is about 0.3 to 1.0 μm, and the thickness of the n⁻-type drift layer 2 is about 5 to 15 μm.

Then, a p⁻-type epitaxial layer (not shown in FIG. 3, but will have a reference number 18 later in FIG. 11) having an impurity concentration of $1 \times 10^{17}$ to $1 \times 10^{18}$/cm³ and a thickness of about 0.6 µm is formed on the entire surface of the drift layer 2. Al or B is used for a p-type impurity species of SiC.

Subsequently, an ion implantation mask (not shown) made of, for example, a silicon oxide film is formed on the top surface of the p⁻-type epitaxial layer (18), and counter ion implantation is selectively carried out for the p⁻-type epitaxial layer (18) using N or P as an ion species, thereby forming the n⁻-type layer 20 (FIG. 11) connected to the drift layer 2 through part of the p⁻-type epitaxial layer. With regard to the species of ion implantation, phosphorous (P) can achieve lower resistance, but nitrogen (N) or a combination of phosphorous and nitrogen (P+N) will also suffice. At this point, multistage ion implantation with a maximum energy of about 400 keV is carried out, and the dose is adjusted so that the impurity concentration may be about $1 \times 10^{16}$ to $3 \times 10^{17}/cm^3$. The n-type region 20 formed at this point contacts the n-type drift layer 2 through the p⁻-type epitaxial layer (18).

After the ion implantation mask has been removed, an ion implantation mask (not shown) is again formed, and the n⁺ source contact 19 having an impurity concentration of about $1 \times 10^{18}$ to $3 \times 10^{19}/cm^3$ and a depth of about 0.3 µm is formed by ion implantation in the p⁻-type epitaxial layer 18. The depth needs to be located within the p⁻-type epitaxial layer 18. Then, a heat treatment at a high temperature of about 1500-2000° C. was carried out for activation.

Then, a silicon oxide film having a thickness of about 30 to 50 µm serving as the gate insulating layer 16 is formed on the top by carrying out wet oxidation and post oxidation annealing (POA) in a hydrogen atmosphere. The gate electrode 17 made of, for example, polysilicon is formed thereon by a CVD method, and a silicon oxide film is further formed thereon by CVD. After patterning with a resist, the silicon oxide film can only be left in the place where the gate electrode is formed. Then, a source electrode layer is formed, and patterned to form the source electrode 3 on a source region.

Then, as in FIG. 6, the surface is protected by, for example, a tape material 13, and the wafer backside is mechanically ground. The velocity of the mechanical grinding, the kind of grinding, etc., are changed to suit to the thickness of the substrate to be ground, and the substrate is finally ground to several micrometers. The point of stopping the grinding is determined by checking the exposure of the ultra-high-concentration layer 5 via a thickness monitor or a C-V measurement using a dummy substrate.

Then, after (simple) cleaning, the drain electrode 4 is formed on the backside of the ultra-high-concentration layer 5 with the substrate holding tape 13 attached. At this point, the drain electrode not only serves as a drain contact but also serves to hold the substrate, so that a thickness of about several tens of micrometers to 100 µm should be provided in the drain electrode by, for example, electroplating. Ti and Ti/Al, for example, are electrode materials suitable for the p-type ohmic contact. However, in the case of a composite material such as Ti/Al, Ti/Al may be first formed by, for example, evaporation, and then Al may be formed thereon by electroplating. Subsequently, the tape material 13 is removed, and then a heat treatment of 950° C. or more is carried out to reduce the contact resistance of the source electrode 3 and the drain electrode 4.

In addition, in the third embodiment, a p-type MOSFET may be provided by the reversal of the n-type and p-type. Moreover, the ultra-high-concentration layer 5 may be formed by ion implantation from the top surface side instead of the epitaxial growth. In that case, the ultra-high-concentration layer 5 formed by the ion implantation needs to be the stop point of the backside polishing. The thinning may be carried out by reactive ion etching (RIE).

Furthermore, the p⁻-type layer 18 on the n-type drift layer 2 may be formed by ion implantation instead of the epitaxial growth. That is, the n-type drift layer is formed with the addition of 0.6 µm to the above-mentioned thickness, and the subsequent p⁻ ion implantation is selectively carried out, thereby producing the p⁻-type layer 18. Subsequently, the n⁺-type source contact 19 is formed, and then the source electrode 3 is formed.

As described above, according to the third embodiment, it is possible to form a vertical MOSFET using SiC layers with low resistance.

Fourth Embodiment

FIG. 13 is a sectional view of essential parts of an IGBT according to a fourth embodiment of the present invention. The IGBT is similar in shape to the MOSFET in the third embodiment, but uses a substrate as shown in FIG. 10 in the second embodiment.

That is, a p⁺⁺-type ultra-high-concentration layer 15 is provided on the top surface side of a SiC substrate 1, and an n⁻-type drift layer 2 is formed thereon via an n-type field stop layer 6. A p⁻-type region 18 is selectively provided on the surface of the n⁻-type drift layer 2. An n⁻-type layer 20 is provided between the p⁻-type regions 18. An n⁺-type emitter contact region 19 is selectively formed on the surface of the p⁻-type region 18. An emitter electrode 3 in ohmic contact is selectively formed on the p⁻-type region 18 and the n⁺-type emitter contact region 19. A gate electrode 17 is selectively formed on the p⁻-type region 18 and the n⁻-type layer 20 via a gate insulating layer 16 made of a thin oxide film or a high dielectric film. A collector electrode 4 is formed in ohmic contact on the backside of the n⁺⁺-type ultra-high-concentration layer 5 exposed by polishing the SiC substrate 1.

As in the vertical MOSFET in FIG. 12, the main resistance components in the vertical IGBT also include emitter contact resistance $R_{sc}$, channel resistance $R_{ch}$, JFET resistance $R_{JFET}$, drift resistance $R_{drift}$ and substrate resistance $R_{sub}$. While the JFET resistance changes depending on a channel length, the contribution of the substrate resistance is about 20% when the channel length is 2.5 µm. Therefore, the substrate resistance can be reduced by the present embodiment, which highly contributes to decreasing of loss in the device.

Furthermore, it is impossible in the present circumstances to produce a p-type SiC thin substrate, so that a product with a high breakdown voltage has only been available in which an SiC-IGBT breakdown voltage is about 5 to 10 kV. However, the present invention makes it possible to produce an IGBT with a low breakdown voltage of, for example, 600 V.

A punch-through type IGBT has a problem in that carriers are generally implanted excessively at the time of turn-on due to a great thickness of the p-type substrate, which slows switching. However, the present embodiment makes it possible to obtain an IGBT capable of adapting to a high frequency as well.

Next, a method of manufacturing the IGBT in the present embodiment is described with the aid of FIGS. 3 to 8 in the first embodiment. First, as in FIG. 3, the p⁺⁺-type layer (not 5 but 15 in the present embodiment) having a thickness of several micrometers to several tens of micrometers and an impurity concentration of about $1 \times 10^{17}$ to $1 \times 10^{21}/cm^3$ is produced on the highly crystalline 4H-SiC substrate 1 by epitaxial growth. As a dopant in this case, aluminum (Al) or boron (B), for example, is used. Then, the n-type field stop layer 6 and the n⁻-type drift layer 2 are formed by epitaxial growth.

N, for example, is used for the impurity species of the n-type field stop layer 6 and the n⁻-type drift layer 2, and the impurity concentration in the n-type field stop layer 6 is about $1\times10^{15}$ to $5\times10^{17}/cm^3$, and the impurity concentration in the n⁻-type drift layer 2 is about $1\times10^{15}$ to $2\times10^{16}/cm^3$ in the case of a design breakdown voltage of 600 V, for example. In the case of the drift layer 2, the impurities can be adjusted in accordance with a design breakdown voltage.

In addition, the thickness of the buffer layer 6 is about 0.3 to 1.0 μm, and the thickness of the n⁻-type drift layer 2 is about 5 to 15 μm.

Furthermore, a p⁻-type epitaxial layer (not shown) having an impurity concentration of $1\times10^{17}$ to $1\times10^{18}/cm^3$ and a thickness of about 0.6 μm is formed on the entire surface of the drift layer 2. Al or B is used for a p-type impurity species of the epitaxial layer. Then, an ion implantation mask (not shown) made of, for example, a silicon oxide film is formed on the top surface of the p⁻-type epitaxial layer, and counter ion implantation is selectively carried out using N and P as ion species, thereby forming the n⁻-type layer 20 connected to the drift layer 2 through part of the p⁻-type epitaxial layer. With regard to the ion species of ion implantation, phosphorous (P) can achieve lower resistance, but nitrogen (N) or a combination of phosphorous and nitrogen (P+N) will also suffice. At this point, multistage ion implantation with a maximum energy of about several hundred keV is carried out, and a dose is adjusted so that the impurity concentration may be about $1\times10^{16}$ to $3\times10^{17}/cm^3$. At this point, the n-type region 20 implanted with the maximum energy is connected to the n-type drift layer 2 through the p⁻-type epitaxial layer.

After the ion implantation mask has been removed, an ion implantation mask is again formed, and the n⁺-type emitter contact 19 having an impurity concentration of about $1\times10^{18}$ to $3\times10^{19}/cm^3$ and a depth of about 0.3 μm is formed (FIG. 13). The depth needs to be located within the p⁻-type epitaxial layer 18. Then, a heat treatment at a high temperature of about 1500-2000° C. was carried out for activation.

Then, a silicon oxide film having a thickness of about 30 to 50 μm serving as the gate insulating layer 16 is formed on the top by wet oxidation, and POA in a hydrogen atmosphere is carried out. The gate electrode 17 made of, for example, polysilicon is formed thereon by the CVD method. A silicon oxide film (not shown) is further formed on the top of the gate electrode 17 by the CVD method. After patterning with a resist, the silicon oxide film is left to cover the gate electrode 17. Then, an electrode layer is formed, and patterned to form the emitter electrode 3 on the emitter contact 20 (FIG. 13).

Then, as in FIG. 6, the surface is protected by, for example, a tape material 13, and the backside is mechanically ground. The velocity of the mechanical grinding, the kind of grinding, etc., are changed to suit to the thickness of the substrate to be ground, and the substrate is finally ground to several micrometers. The point of stopping the grinding is determined by checking the exposure of the ultra-high-concentration layer 15 via a thickness monitor or a C-V measurement using a dummy substrate. Then, after simple cleaning, the collector electrode 4 is formed on the ultra-high-concentration layer 15 with the substrate holding tape 13 attached. At this point, the collector electrode 4 not only serves as a collector contact but also serves to hold the substrate, so that a thickness of about several tens of micrometers to 100 μm should be provided in the collector electrode 4 by, for example, electroplating.

Ti and Ti/Al, for example, are metals suitable for the collector electrode 4. However, in the case of a composite material such as Ti/Al, Ti/Al may be first formed by, for example, evaporation, and then Al may be formed thereon by electroplating. Subsequently, the tape material 13 is removed, and then a heat treatment of 950° C. or higher is carried out to reduce the contact resistance of the electrodes. In this manner, the vertical IGBT is completed.

As described above, according to the fourth embodiment, it is possible to form a vertical IGBT using SiC layers with low resistance.

In addition, the above-mentioned ultra-high-concentration layer 5 or 15 contains impurities at a concentration of $1\times10^{19}/cm^3$ or more which can be generally introduced without decreasing crystal quality in single crystal growth. This can be proved by checking, in accordance with an analysis method such as SIMS, the concentration of impurities combining N and P which is an n-type impurity of SiC.

Moreover, when ions are implanted from the top surface of the device with presently existing maximum acceleration energy, the profile shows that the maximum concentration is reached at several micrometers from the top surface of the substrate, which is known to tail further. In this case, the ion implantation also introduces a crystalline damage (observable by TEM observation) at the same time from the top surface side to the backside of the substrate, but this damage is only confined in the substrate and does not harm the buffer layer and the drift layer which hold the breakdown voltage.

Another method is to implant ions from the opposite side of the top surface of the substrate after the thickness of the substrate has been reduced, and anneal the substrate with laser. The problem of this method is that the tail of the ion-implanted layer and a crystalline damage reach the side of the buffer layer and the drift layer and therefore cause the degradation of the breakdown voltage.

On the contrary, when ions are implanted from the backside so that ion-implanted region including the tail part may all be contained in the substrate, the impurity concentration on the top surface side can not be high, leading to the problem of an insufficient reduction of on-resistance.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of forming semiconductor device comprising:
   preparing a semiconductor substrate that includes:
   a silicon carbide substrate having a first impurity concentration;
   a first silicon carbide layer formed on a top surface of the silicon carbide substrate by ion implantation and having a second impurity concentration; and
   a second silicon carbide layer formed on the first silicon carbide layer and having a third impurity concentration,
   wherein the second impurity concentration is higher than either the first impurity concentration or the third impurity concentration;
   forming a semiconductor element on the second silicon carbide layer;
   backside-polishing a backside of the semiconductor substrate to expose the first silicon carbide layer after said forming the semiconductor element; and
   forming a first electrode in ohmic contact with the exposed first silicon carbide layer.

2. The method according to claim 1, further comprising, forming a third silicon carbide layer between the first silicon carbide layer and the second silicon carbide layer, the third silicon carbide layer having an impurity concentration lower than the second impurity concentration and higher than the third impurity concentration, the third silicon carbide layer and the second silicon carbide layer being of a same conductivity type.

3. The method according to claim 1, wherein the first silicon carbide layer is formed to a thickness of 2.5 µm or more and 3.5 µm or less.

4. The method according to claim 1, wherein
the first silicon carbide layer is formed as a first conductivity type having a thickness of 3.5 µm or less,
the second silicon carbide layer is formed as the first conductivity type, and
a second electrode is formed on a top surface of the second silicon carbide layer to make a Schottky contact with the second silicon carbide layer,
thereby forming a Schottky barrier diode as the semiconductor element.

5. The method according to claim 4, wherein the first conductivity type is an n-type, and the second impurity concentration of the first silicon carbide layer is formed to be $1 \times 10^{20}/cm^3$ or more and $1 \times 10^{22}/cm^3$ or less.

6. The method according to claim 1, wherein
the first silicon carbide layer is formed as the first conductivity type having a thickness of 3.5 µm or less,
the second silicon carbide layer is formed as a second conductivity type, and
a second electrode is formed on a top surface of the second silicon carbide layer, thereby forming a pn diode.

7. The method according to claim 6, wherein the second conductivity type is a p-type, and the second impurity concentration of the first silicon carbide layer is formed to be $1 \times 10^{17}/cm^3$ or more and $1 \times 10^{21}/cm^3$ or less.

8. The method according to claim 1, wherein
the first silicon carbide layer has a thickness of 3.5 µm or less,
the second silicon carbide layer is formed as the first conductivity type, and
the semiconductor element further includes:
a first silicon carbide region of a second conductivity type selectively provided on the second silicon carbide layer of the first conductivity type;
a second silicon carbide region of the first conductivity type formed on a surface of the first silicon carbide region and inside the first silicon carbide region;
a gate insulating layer selectively formed on the second silicon carbide layer, on the first silicon carbide region adjacent to the second silicon carbide layer, and on a surface of the second silicon carbide region;
a gate electrode formed on the gate insulating layer; and
a second electrode selectively formed on the first silicon carbide region and the second silicon carbide region.

9. The method according to claim 8, wherein the first silicon carbide layer is formed as the first conductivity type, thereby forming a MOSFET.

10. The method according to claim 9, wherein the first conductivity type is of an n-type, and the second impurity concentration of the first silicon carbide layer is $1 \times 10^{20}/cm^3$ or more and $1 \times 10^{22}/cm^3$ or less.

11. The method according to claim 8, wherein the first silicon carbide layer is of the second conductivity type, thereby forming an IGBT.

12. The method according to claim 11, wherein the first conductivity type is of a p-type, and the second impurity concentration of the first silicon carbide layer is $1 \times 10^{17}/cm^3$ or more and $1 \times 10^{21}/cm^3$ or less.

* * * * *